(12) United States Patent
Beaman

(10) Patent No.: US 6,746,937 B2
(45) Date of Patent: Jun. 8, 2004

(54) PD-SOI SUBSTRATE WITH SUPPRESSED FLOATING BODY EFFECT AND METHOD FOR ITS FABRICATION

(75) Inventor: Kevin L. Beaman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/443,023

(22) Filed: May 22, 2003

(65) Prior Publication Data

US 2003/0203593 A1 Oct. 30, 2003

Related U.S. Application Data

(60) Continuation of application No. 09/930,451, filed on Aug. 16, 2001, now abandoned, which is a division of application No. 09/587,190, filed on Jun. 5, 2000, now Pat. No. 6,437,375.

(51) Int. Cl.$^7$ ................................. H01L 21/30
(52) U.S. Cl. .................... 438/455; 438/459; 438/476; 438/479
(58) Field of Search ................ 438/149, 311, 438/406, 409, 451–459, 471–479, 751–753, 933, 960; 257/19, 347–349

(56) References Cited

U.S. PATENT DOCUMENTS

| | | | |
|---|---|---|---|
| 4,962,051 A | 10/1990 | Liaw | |
| 4,962,061 A * | 10/1990 | Takata | 438/622 |
| 5,240,876 A * | 8/1993 | Gaul et al. | 438/459 |
| 5,261,999 A * | 11/1993 | Pinker et al. | 438/459 |
| 5,298,452 A | 3/1994 | Meyerson | |
| 5,344,524 A * | 9/1994 | Sharma et al. | 438/459 |
| 5,461,243 A | 10/1995 | Ek et al. | |
| 5,476,813 A * | 12/1995 | Naruse | 438/311 |
| 5,489,792 A | 2/1996 | Hu et al. | |
| 5,534,713 A | 7/1996 | Ismail et al. | |
| 5,891,769 A * | 4/1999 | Liaw et al. | 438/167 |
| 5,906,951 A | 5/1999 | Chu et al. | |
| 5,961,877 A * | 10/1999 | Robinson et al. | 252/79.2 |
| 2001/0003269 A1 * | 6/2001 | Wu et al. | 117/94 |

* cited by examiner

Primary Examiner—T. N. Quach
(74) Attorney, Agent, or Firm—Dickstein Shapiro Morin & Oshinsky LLP

(57) ABSTRACT

A partially-depleted Silicon-on-Insulator (SOI) substrate with minimal charge build up and suppressed floating body effect is disclosed, as well as a simple method for its fabrication. A thin Si/Ge epitaxial layer is grown between two adjacent epitaxial silicon layers of a SOI substrate, and as part of the silicon epitaxial growth. The thin Si/Ge epitaxial layer introduces misfit dislocations at the interface between the thin Si/Ge epitaxial layer and the adjacent epitaxial silicon layers, which removes undesired charge build up within the substrate.

12 Claims, 6 Drawing Sheets

PD-SOI SUBSTRATE WITH SUPPRESSED FLOATING BODY EFFECT AND METHOD FOR ITS FABRICATION

This application is a continuation of application Ser. No. 09/930,451, filed Aug. 16, 2001, now abandoned, which is a divisional of application Ser. No. 09/587,190, filed Jun. 5, 2000, issued as U.S. Pat. No. 6,437,375 on August 20, 2002, the entire disclosure of which is incorporated herein by reference and claims priority thereto.

FIELD OF THE INVENTION

The present invention relates to the field of semiconductor integrated circuits and, in particular, to partially-depleted Silicon on Insulator (PD-SOI) substrates and devices.

BACKGROUND OF THE INVENTION

Silicon on Insulator (SOI) technology employs a layer of semiconductor material formed over an insulating layer on a supporting bulk wafer. The structure can be formed by different well-known techniques in the art, for example, separation by implanted oxygen (SIMOX), bonding and etching back (BESOI), and zone melting and recrystallization (ZMR), among others. Typically, the structure comprises a film of monocrystalline silicon formed on a buried layer of silicon oxide which is formed on a monocrystalline silicon substrate. As such, in many SOT applications, an epitaxial (epi) silicon layer is used as a top silicon layer, which is generally formed by one of two methods: (1) bonding followed by etch back; or (2) epitaxial layer transfer (ELTRAN) process.

One technique for the formation of a SOI substrate by a conventional bonding and etching back method of the prior art is illustrated in FIGS. 1–4. The process starts with the preparation of a silicon substrate 10 (FIG. 1). The silicon substrate 10 is thermally oxidized to grow a layer of silicon oxide 12 (FIG. 1), with a thickness of about 1 micron. Subsequently, an n-type single crystalline silicon substrate 14 is opposed to the silicon oxide layer 12, as shown in FIG. 2. The silicon substrate 10, with the oxide layer 12, is then contacted with the crystalline silicon substrate 14, and the resultant structure is heated to a temperature of about 1000° C., so that the n-type crystalline silicon of the crystalline silicon substrate 14 adheres to the silicon oxide layer 12, as shown in FIG. 3. Next, as illustrated in FIG. 4, the n-type crystalline silicon substrate 14 is polished and its thickness is decreased to approximately 1.5 microns. Thus, a SOI substrate 15 (FIG. 4) is formed of the silicon substrate 10, the silicon oxide layer 12, and the n-type crystalline silicon substrate 14.

Field effect transistors such as MOSFETs, which are fabricated in the upper silicon layer of a SOI structure, such as the SOI substrate 15 of FIG. 4, have multiple advantages over the transistors fabricated on the conventional bulk silicon substrates. These advantages include, among others, resistance to short-channel effect, increased current drive, higher packing density, and reduced parasitic capacitance. However, despite all these attractive properties, SOI technology still has some drawbacks, which reduce the benefits of using it for high-performance and high-density ultra large scale integrated (ULSI) circuits.

One drawback of the SOI technology is the conductivity of the top Si layer and its inherent floating body effect, which has particular significance for partially-depleted (PD) or non-filly depleted SOI devices. The floating body effect in such devices occurs as a result of the buried oxide that isolates the channel region of such device and allows charge carriers to build up in the channel region. In a partially-depleted MOSFET, charge carriers (holes in an nMOSFET and electrons in a pMOSFET), generated by impact ionization near the drain/source region, accumulate near the source/drain region of the transistor. When sufficient carriers accumulate, they are stored in the floating body, which is formed right below the channel region, and alter the floating body potential. As a result, kinks in the I/V curve occur, the threshold voltage is lowered, and the overall electrical performance of the device may be severely degraded.

To diminish the negative effects of the charge build up, so-called "recombination centers" can be introduced into the transistor channel region. According to this technique, damage areas containing implanted ions are placed where the charges accumulate, so that holes and electrons can combine or recombine and accumulated charges removed.

Another technique for diminishing the negative effects of the charge build up has been to provide an extra electrical connection by adding a contact to the body for hole current collection. However, the currently available hole collection schemes, such as the use of a side-contact, are inefficient, require very complex processing steps, and consume a great amount of device area.

Accordingly, there is a need for an improved method for forming a partially-depleted SOI device having reduced charge build up and accompanying threshold voltage changes and charge leakage. There is also a need for an integrated process for epi-SOI wafer fabrication, in which recombination centers are created with fewer processing steps and which saves wafer area. A defect-free partially-depleted SOI substrate is also needed.

SUMMARY OF THE INVENTION

The present invention provides a simple method for forming a partially-depleted Silicon-on-Insulator (SO) substrate with minimal charge build up to mitigate the floating body effect, which can be further used for the fabrication of SOI devices with reduced threshold voltage and leakage.

The method of the present invention employs a thin Si/Ge epitaxial layer grown between two adjacent epitaxial silicon layers of the partially-depleted SOI substrate. The thin Si/Ge epitaxial layer, grown during the epitaxial growth of silicon, introduces misfit dislocations, which are formed as a result of the lattice mismatch between the silicon and germanium atoms, and which act as both recombination sites and proximity gettering sites. After the growth of the thin Si/Ge epitaxial layer and the formation of the partially-depleted (PD) SOI device, the newly-formed dislocations lie close to the buried oxide and remove the accumulated charges, so that the performance of the partially-depleted (PD) SOI device remains largely unaffected by charge build up.

The above and other advantages and features of the present invention will be more clearly understood from the following detailed description which is provided in connection with the accompanying drawings.

DETAILED DESCRIPTION OF THE PREFERRED EMBODIMENTS

Figure 1:
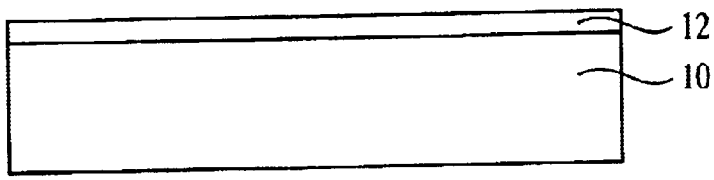
FIG. 1 is a cross-sectional view of a SOI substrate at an initial stage of processing and in accordance with a method of the prior art.

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

The present invention provides a method for forming a partially-depleted Silicon-on-Insulator (SOI) substrate with minimal charge build up and reduced floating body effect. The method of the present invention employs a thin Si/Ge epitaxial layer formed between two adjacent epitaxial silicon layers of a partially-depleted SOI device. The thin Si/Ge epitaxial layer, grown during the epitaxial growth of silicon, introduces misfit dislocations, which are formed as a result of the lattice mismatch between the silicon and germanium atoms and which act as both recombination sites and proximity gettering sites.

Referring now to the drawings, where like elements are designated by like reference numerals, FIGS. 5–11 illustrate a method for the fabrication of a partially-depleted SOI substrate 100 (FIG. 11) according to the present invention, in which the floating body effect is suppressed.

Figure 5:
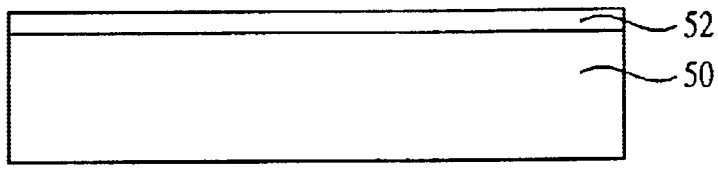
FIG. 5 is a cross-sectional view of a partially-depleted SOI substrate at an initial stage of processing and in accordance with a first embodiment of the present invention.

First, as shown in FIG. 5, a first silicon substrate 50 is oxidized to thermally grow an insulating layer 52, for example, a silicon oxide insulating layer 52. The thermal oxidation of the first silicon substrate 50 could take place, for example, in an oxygen ($O_2$) or water ($H_2O$) vapor ambient, at temperatures of about 750–1000° C., depending on the desired oxidation rate. The silicon oxide insulating layer 52 may be formed, for example, of silicon dioxide ($SiO_2$), up to a thickness of approximately 1 micron. However, as well-known in the art, the thickness of the silicon oxide insulating layer 52 may vary greatly, depending on the processing requirements and desired device characteristics.

Although reference to the thermally grown insulating layer 52 will be made in this application as to the silicon dioxide layer 52, it must be understood that the present invention has applicability to other types of thermally grown insulating oxides. Thus, the present invention is not limited to silicon oxides, and other oxides, such as a oxynitrides and saphire-intermediate oxides grown by chemical vapor deposition (CVD), may be used also in accordance with the characteristics of the particular SOI device.

Similarly, although the present invention is explained with reference to a silicon substrate, such as the first silicon substrate 50 (FIG. 5), it must be understood that the substrate need not be silicon-based. Thus, the invention has equal applicability to other semiconductor substrates, such as, for example, silicon-germanium, germanium, silicon-on-saphire, or gallium-arsenide substrates.

Figure 6:
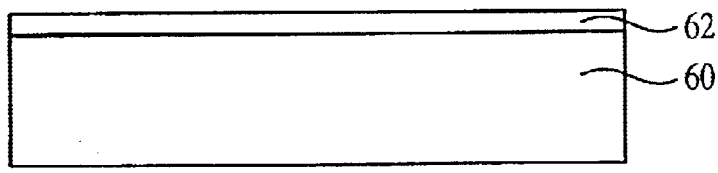
FIG. 6 is a cross-sectional view of the partially-depleted SOI substrate of FIG. 5 at a stage of processing subsequent to that shown in FIG. 5.

Referring now to FIG. 6, on a second silicon substrate 60, a first epitaxial silicon layer 62 is formed according to well-known methods of the art. The first epitaxial silicon layer 62 could be formed by a process such as liquid phase epitaxy (LPE), ultra high vacuum (UHV) chemical vapor deposition (CVD), vapor phase epitaxy (VPE), or metal organic vapor phase epitaxy (MOVPE), among others.

In an exemplary embodiment of the present invention, the first epitaxial silicon layer 62 (FIG. 6) is grown by epitaxy in a reaction chamber at high temperatures, of about 900–1200° C., and by employing a silicon gas source that introduces a gaseous species containing silicon (Si) into the reaction chamber. As known in the art, the silicon gas source may be silane ($SiH_4$), higher order silanes, such as disilane ($Si_2H_6$), as well as other gaseous sources of silicon, such as diclorsilane ($SiH_2Cl_2$), trichlorsilane ($SiHCl_3$), or tetrachlorsilane ($SiCl_4$). In any event, the first epitaxial silicon layer 62 is grown over the second silicon substrate 60 to a thickness of about 500–3,000 Angstroms, and preferably of about 1,500 Angstroms.

Figure 7:
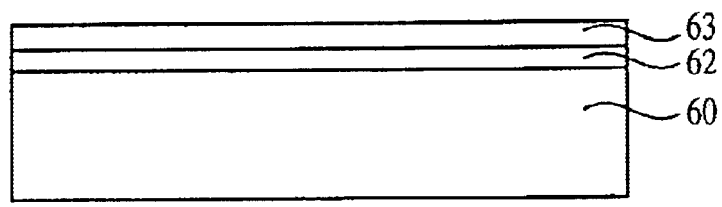
FIG. 7 is a cross-sectional view of the partially-depleted SOI substrate of FIG. 5 at a stage of processing subsequent to that shown in FIG. 6.

Once the growth of the first epitaxial silicon layer 62 is completed, and while the second silicon substrate 60 is still in the reaction chamber, a silicon (Si) and germanium (Ge) gas source is next used to introduce a gaseous species containing silicon and germanium in the same reaction chamber, for a further deposition of a thin Si/Ge epitaxial layer 63, shown in FIG. 7.

The silicon gas source may be, for example, a silane ($SiH_4$) source or any other silicon gas source employed in the formation of the first epitaxially grown layer 62 (FIG. 6). The germanium gas source may be, for example, a germane ($GeH_4$) source, or any other gaseous source containing germanium. The combination of the two gaseous sources allows deposition of the thin Si/Ge epitaxial layer 63 (FIG. 7) to a thickness of about 100–300 Angstroms, more preferably of about 200 Angstroms, at a deposition temperature of about 900–1200° C.

The thin Si/Ge epitaxial layer 63 has a germanium composition of approximately 0.5–6% of the total composition, more preferably of about 2%. The thickness of the Si/Ge epitaxial layer 63 is proportional to, and depends upon, the deposition time.

Figure 10:
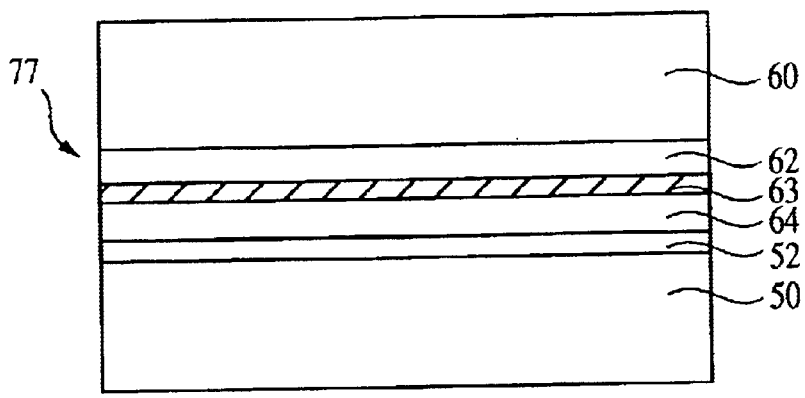
FIG. 10 is a cross-sectional view of the partially-depleted SOI substrate of FIG. 5 at a stage of processing subsequent to that shown in FIG. 9.
Figure 11:
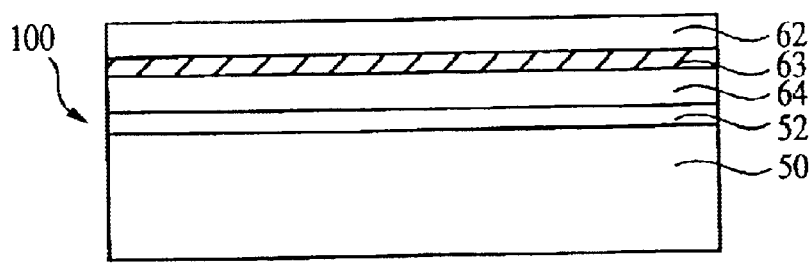
FIG. 11 is a cross-sectional view of the partially-depleted SOI substrate of FIG. 5 at a stage of processing subsequent to that shown in FIG. 10.

The presence of the thin Si/Ge epitaxial layer 63 (FIG. 7) induces misfit dislocations at the interface between the first epitaxial silicon layer 62 and the Si/Ge epitaxial layer 63. These misfit dislocations are the result of a mismatch between the lattice of the crystalline silicon (from the first epitaxial silicon layer 62) and the lattice of germanium (from the Si/Ge epitaxial layer 63), the germanium atoms being much larger than the silicon ones. These dislocations serve as efficient carrier recombination centers for devices, such as transistors later formed on the partially-depleted SOI substrate 100 (FIG. 10). The recombination centers allow charge carriers, which typically accumulate near the drain/source region of a transistor and are stored in a floating body, to recombine and be removed.

These misfit dislocations are rather random at the epitaxial silicon and Si/Ge interface. However, their concentration can be predicted based on the thickness of the two adjacent layers, the first epitaxial silicon layer 62 and the Si/Ge epitaxial layer 63, respectively, and upon the germanium concentration in the Si/Ge epitaxial layer 63. Thus, persons skilled in the art will be able to predict the number of charge recombination centers and/or proximity sites present in a SOI device based on the germanium concentration in the Si/Ge epitaxial layer 63 (FIG. 7).

Figure 8:
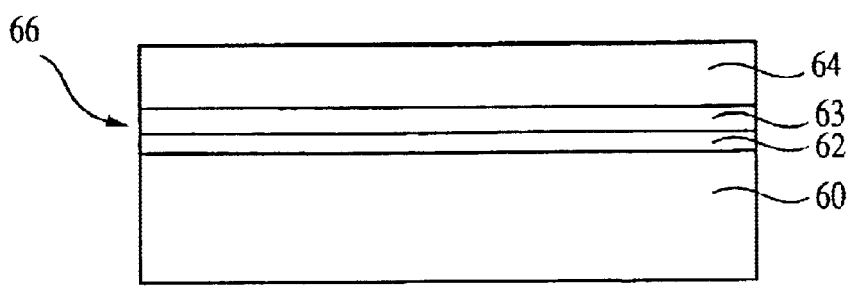
FIG. 8 is a cross-sectional view of the partially-depleted SOI substrate of FIG. 5 at a stage of processing subsequent to that shown in FIG. 7.

Reference is now made to FIG. 8. After the growth of the thin Si/Ge epitaxial layer 63, a second epitaxial silicon layer 64 is grown over the thin Si/Ge epitaxial layer 63, in the same reaction chamber used for the formation of the previous epitaxially grown layers, by shutting off the germanium gaseous source. Thus, the second epitaxial silicon layer 64 is grown at high temperatures, of about 900–1200° C., and by employing same silicon gas source that was used in the previous steps, with respect to the gaseous species containing silicon (Si). The thickness of the second epitaxial silicon layer 64 is of about 300–1500 Angstroms, more preferably of about 500 Angstroms.

Misfit dislocations, similar to those present at the interface between the first epitaxial silicon layer 62 and the thin Si/Ge epitaxial layer 63, also occur at the interface between the thin Si/Ge epitaxial layer 63 and the second epitaxial silicon layer 64. These misfit dislocations also create additional carrier recombination centers and gettering sites for the partially-depleted SOI substrate 100.

The second silicon substrate 60, the first epitaxial silicon layer 62, the thin Si/Ge epitaxial layer 63, together with the second epitaxial silicon layer 64 form a Si/Ge layered structure 66 (FIG. 8), which, as explained above, induces misfit dislocations and allows a predictable number of recombination centers to form at the interfaces between the epitaxial silicon layer 62, 64 and the Si/Ge epitaxial layer 63.

Figure 2:
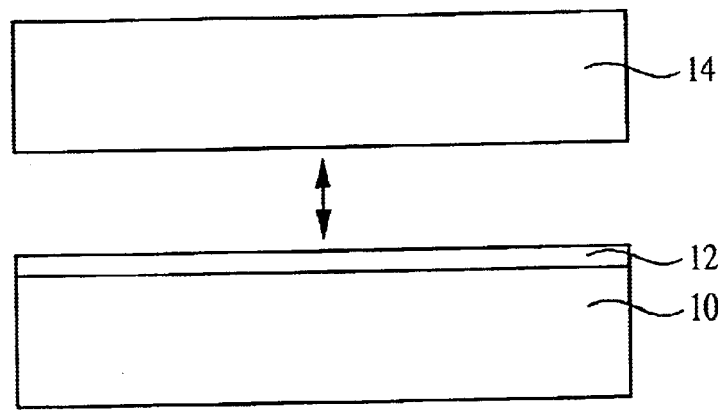
FIG. 2 is a cross-sectional view of the SOI substrate of FIG. 1 at a stage of processing subsequent to that shown in FIG. 1.
Figure 3:
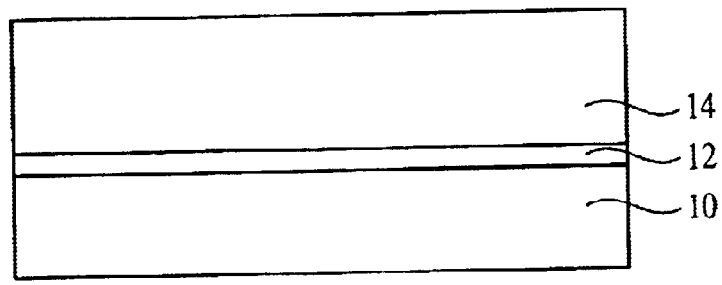
FIG. 3 is a cross-sectional view of the SOI substrate of FIG. 1 at a stage of processing subsequent to that shown in FIG. 2.
Figure 4:
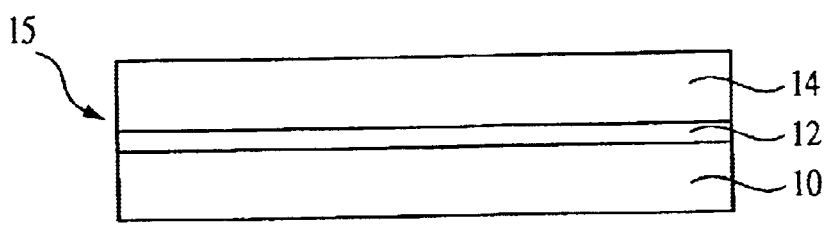
FIG. 4 is a cross-sectional view of the SOI substrate of FIG. 1 at a stage of processing subsequent to that shown in FIG. 3.
Figure 9:
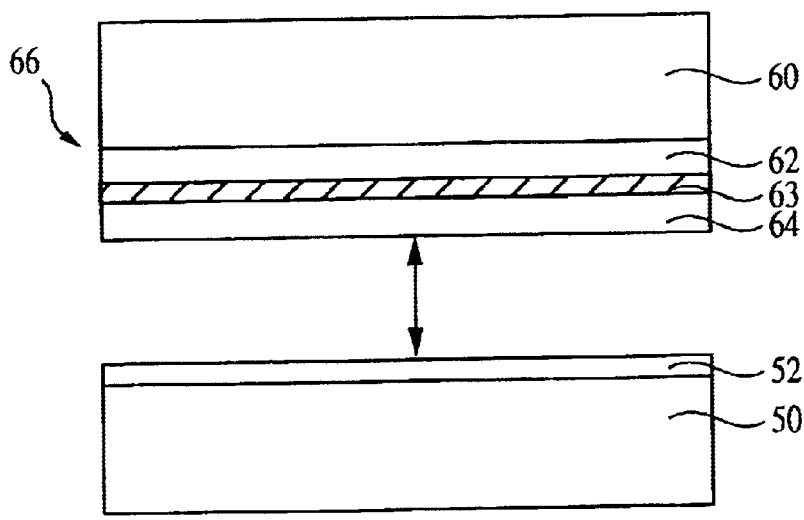
FIG. 9 is a cross-sectional view of the partially-depleted SOI substrate of FIG. 5 at a stage of processing subsequent to that shown in FIG. 8.

Reference is now made to FIG. 9, which shows the Si/Ge layered structure 66 being brought into contact with the first silicon substrate 50, which has the thermally grown silicon dioxide layer 52 formed thereover, so that the second epitaxial silicon layer 64 opposes the thermally grown silicon dioxide layer 52. Processing steps for the fabrication of the partially-depleted SOI substrate 100 (FIG. 11) are now carried out in accordance with those of the prior art and explained above with reference to FIGS. 2–4.

Thus, referring now to FIG. 10, the first silicon substrate 50, with the thermally grown silicon dioxide layer 52, is contacted with the Si/Ge layered structure 66 to form a resultant two-substrate structure 77 (FIG. 10). The two-substrates structure 77 is then heated to a temperature of about 900–1200° C., more preferably of about 1000° C., so that the crystalline silicon from the second epitaxial silicon layer 64 adheres and bounds to the silicon dioxide layer 52.

Next, the second silicon substrate 60 of the two-substrate structure 77 of FIG. 10 is etched back to form a partially-depleted SOI substrate 100 (FIG. 11) of about 1.5 microns thick. The partially-depleted SOI substrate 100 is thus formed of the first silicon substrate 50, the thermally grown silicon dioxide layer 52, the second epitaxial silicon layer 64, the thin Si/Ge epitaxial layer 63, and the first epitaxial silicon layer 62. The thin Si/Ge epitaxial layer 63, formed between the first and second epitaxial silicon layers 62, and 64, respectively, induces the misfit dislocations discussed above into the resulting substrate structure at the interface of layers 62, 63 and 63, 64.

Figure 12:
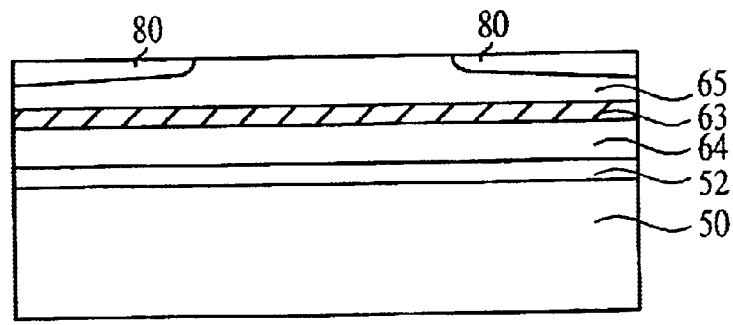
FIG. 12 is a cross-sectional view of a portion of a MOSFET having a partially-depleted SOI substrate according to the present invention.
Figure 13:
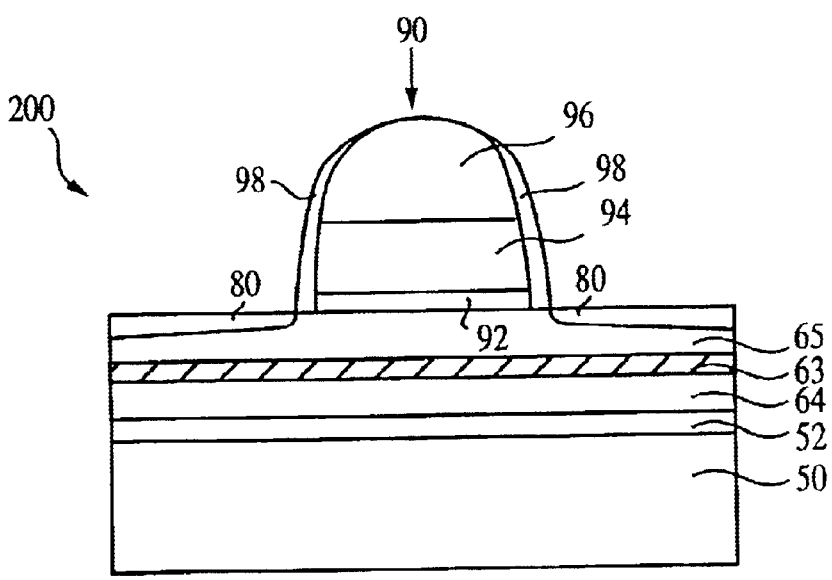
FIG. 13 is a cross-sectional view of the MOSFET structure of FIG. 12 at a stage of processing subsequent to that shown in FIG. 12.

The partially-depleted SOI substrate 100 (FIG. 11) fabricated in accordance with the present invention may now be used for the fabrication of a MOSFET, for example, an n-p-n type transistor 200 (FIG. 13). For this, the first epitaxial silicon layer 62 of the partially-depleted SOI substrate 100 is first implanted with p-type dopant impurity ions, such as boron (B), beryllium (Be) or magnesium (Mg), to form a p-type silicon layer 65 (FIG. 12). Subsequently, an ion implantation mask (not shown) is formed on the p-type silicon layer 65, so that the p-type silicon layer 65 undergoes another ion implantation, this time with n-type dopant impurity ions, such as phosphorus (P), arsenic (As), or sulfur (S). This way, source and drain regions 80 (FIG. 12), which are heavily doped with n-type impurity ions, are formed within the p-type silicon layer 65.

A gate stack 90 (FIG. 13) is subsequently formed over the p-type silicon layer 65, including the already formed source/drain doped regions 80, by well-known methods of the art. The gate stack 90 includes an oxide layer 92, a conductive layer 94, such as polysilicon, a nitride cap 96, and nitride spacers 98. Thus, an n-p-n type transistor 200 (FIG. 13) is formed of the gate stack 90, and the n-type source/drain regions 80 of the p-type silicon layer 65. Transistor 200 may be used as an access transistor in a memory device such as a random access memory device. To this end, further well-known processing steps to create a functional memory cell containing the partially-depleted SOI substrate 100 (FIG. 11) may now be carried out.

Figure 14:
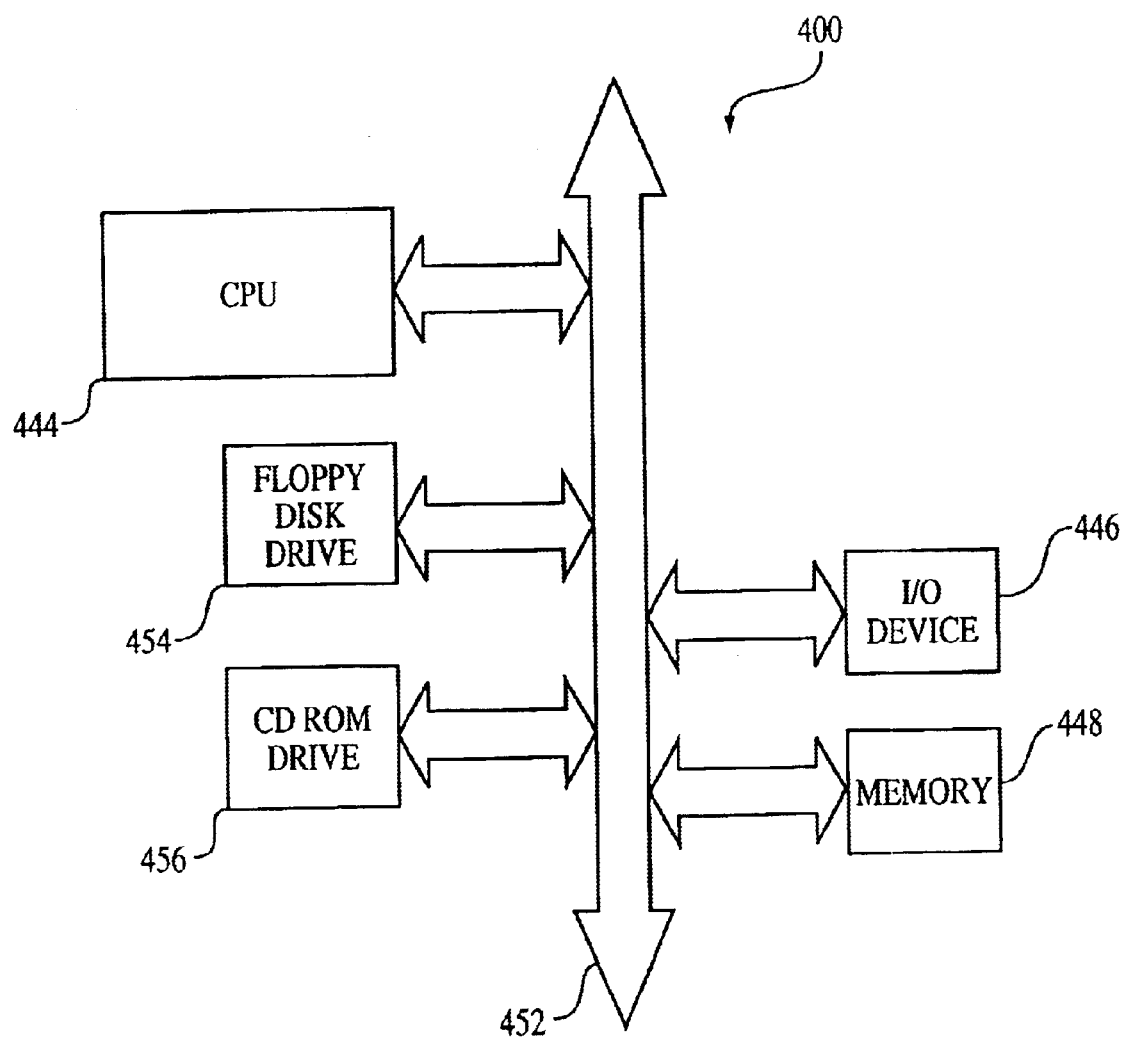
FIG. 14 is an illustration of a computer system having a memory cell access transistor constructed on a partially-depleted SOI substrate according to the present invention.

A typical processor based system 400 which includes a memory circuit 448, for example a DRAM, containing a partially-depleted SOI substrate according to the present invention is illustrated in FIG. 14. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes the partially-depleted SOI substrate 100 formed as previously described with respect to FIGS. 5–11. The memory 448 may be combined with the processor, e.g. CPU 444, in a single integrated circuit.

Although the invention has been illustrated for a MOSFET device fabricated on a p-type substrate, the invention could also be fabricated on an n-type substrate, as well-known in the art. This, of course, will change the doping or conductivity of the operative layers in the fabricated device.

Similarly, although the invention has been illustrated for an n-p-n type transistor, such as the n-p-n type transistor 200 (FIG. 13), employing a p-type silicon layer, such as the p-type silicon layer 65, formed by ion implantation after the formation of the partially-depleted SOI substrate 100 (FIG. 11), it must be understood that the present invention is not limited to this exemplary embodiment. Accordingly, the conductivity doping of the silicon layer 65 (FIGS. 12–13) could be also conducted during, and not after, the formation of the partially-depleted SOI substrate. For example, after the growth of the first epitaxial silicon layer 62 (FIG. 6) over the second silicon substrate 60, the first epitaxial silicon layer 62 can be doped with n-type or p-type dopant impurity atoms, to achieve the desired conductivity.

Although the present invention has been described for a partially-depleted SOI substrate 100 (FIGS. 5–11) with a thin Si/Ge layer epitaxial layer formed by a bonding and etching back method, it must be understood that the present invention is not limited to the above fabrication method. Accordingly, other methods known in the art, for example, the ELTRAN process, may be also used, as long as a thin Si/Ge layer epitaxial layer is formed between two epitaxial layers of silicon.

Figure 15:
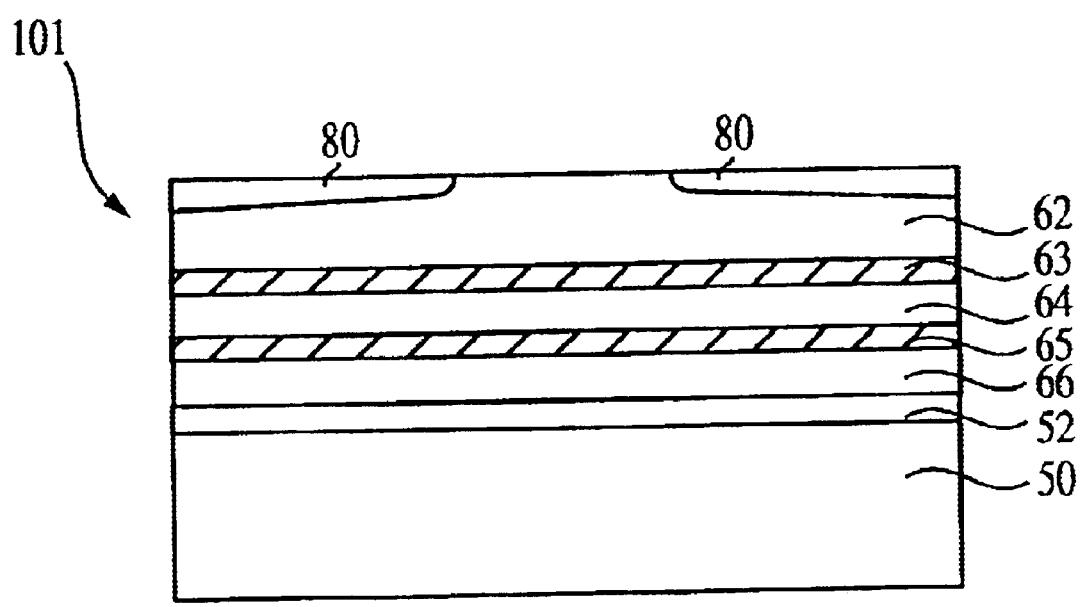
FIG. 15 a cross-sectional view of a partially-depleted SOI substrate at an initial stage of processing and in accordance with a second embodiment of the present invention.

Further, although the exemplary embodiment of the present invention has been described for a partially-depleted SOI substrate 100 (FIGS. 5–11) with only one thin Si/Ge layer epitaxial layer 63, it must be understood that the present invention is not limited to the above-described exemplary embodiment and a plurality of thin Si/Ge layer epitaxial layers may be interleaved with epitaxial silicon layers to create a plurality of misfit dislocation regions. For example, one such embodiment is illustrated in FIG. 15, in which a partially-depleted SOI substrate 101 includes two thin Si/Ge layer epitaxial layers 63, and 65, respectively, interleaved with three epitaxial silicon layers 62, 64, and 66, respectively. This way, misfit dislocation regions are created in the partially-depleted SOI substrate 101 at the interface of layers 62, 63; 63, 64; 64, 65; and 65, 66. The second Si/Ge layer epitaxial layers 65 may be fabricated in the same manner and to the same thickness as that for the formation of the Si/Ge layer epitaxial layers 63, described above with reference to FIG. 7. Similarly, the third epitaxial silicon layers 66 may be fabricated in a manner similar to that employed for the fabrication of the second epitaxial silicon layer 64, described above with reference to FIG. 8.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for forming a SOI structure, comprising the steps of:

forming an oxide layer over a first semiconductor substrate;

forming a first silicon layer over a second silicon substrate;

forming a silicon/germanium layer over said first silicon layer, said silicon/germanium layer comprising about 0.5 to 6% germanium, said silicon/germanium layer forming a layer of misfit dislocation regions;

forming a second silicon layer over said silicon/germanium layer, said second silicon layer of said SOI structure grown in a chamber using no germanium gaseous source;

bonding said second silicon layer to said oxide layer; and etching back said second silicon substrate.

2. A The method of claim 1, wherein said silicon/germanium layer is grown epitaxially over said first silicon layer.

3. The method of claim 1, wherein said silicon/germanium layer is approximately 100 to 300 Angstroms thick.

4. The method of claim 1, wherein said silicon/germanium layer is approximately 200 Angstroms thick.

5. The method of claim 1, wherein said silicon/germanium layer comprises approximately 5% of germanium.

6. The method of claim 1, wherein said first silicon layer is an epitaxial silicon layer.

7. The method of claim 6, wherein said first epitaxial silicon layer is approximately 500 to 3,000 Angstroms thick.

8. The method of claim 6, wherein said first epitaxial silicon layer is approximately 1,500 Angstroms thick.

9. The method of claim 1, wherein said second silicon layer is an epitaxial silicon layer.

10. The method of claim 9, wherein said second epitaxial silicon layer is approximately 300 to 1,500 Angstroms thick.

11. The method of claim 9, wherein said second epitaxial silicon layer is approximately 500 Angstroms thick.

12. The method of claim 1, wherein said step of forming said oxide layer over said first semiconductor substrate further comprises thermally oxidizing said first semiconductor substrate.

* * * * *